United States Patent
Tsang

(10) Patent No.: US 7,683,810 B2
(45) Date of Patent: Mar. 23, 2010

(54) CODE DESIGN WITH DECREASED TRANSITION DENSITY AND REDUCED RUNNING DIGITAL SUM

(75) Inventor: Kinhing Paul Tsang, Plymouth, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 36 days.

(21) Appl. No.: 12/108,088

(22) Filed: Apr. 23, 2008

(65) Prior Publication Data

US 2009/0267811 A1    Oct. 29, 2009

(51) Int. Cl.
*H03M 7/00* (2006.01)
(52) U.S. Cl. ......................... 341/59; 341/58
(58) Field of Classification Search ............... 341/58–59
See application file for complete search history.

(56) References Cited

U.S. PATENT DOCUMENTS

| | | | |
|---|---|---|---|
| 4,408,189 A | 10/1983 | Betts et al. | |
| 5,270,714 A | 12/1993 | Tanaka et al. | |
| 5,422,597 A | 6/1995 | Stengel et al. | |
| 5,784,409 A | 7/1998 | Coles | |
| 5,910,969 A | 6/1999 | Sayiner et al. | |
| 6,664,905 B1 | 12/2003 | Coene | |
| 6,731,228 B2 | 5/2004 | Shu et al. | |
| 6,891,483 B2 * | 5/2005 | Noda et al. | 341/58 |
| 6,909,385 B2 | 6/2005 | Vasic et al. | |
| 6,989,776 B2 | 1/2006 | Tsang | |
| 7,002,492 B2 | 2/2006 | Tsang et al. | |
| 7,088,268 B2 | 8/2006 | Tsang | |
| 7,203,884 B2 | 4/2007 | Dati et al. | |
| 2007/0067509 A1 | 3/2007 | Kuijper et al. | |

* cited by examiner

*Primary Examiner*—Khai M Nguyen
(74) *Attorney, Agent, or Firm*—Leanne Taveggia Farrell; Westman, Champlin & Kelly, P.A.

(57) ABSTRACT

In accordance with one or more embodiments data may be encoded into a code word that meets run length constraints and has a reduced running digital sum by encoding (N−y)−1 data bits and y flag bits into m first n-bit patterns that form a first N-bit code word, producing a second N-bit code word by encoding the (N−y)−1 data bits and the y flag bits into m second n-bit patterns in which corresponding first and second n-bit patterns combine to meet a first predetermined running digital sum threshold, and selecting the code word that satisfies selection criteria. The selection criteria may, for example, be the word with the fewest transitions, the word with the smallest running digital sum, and so forth.

22 Claims, 6 Drawing Sheets

CODE DESIGN WITH DECREASED TRANSITION DENSITY AND REDUCED RUNNING DIGITAL SUM

BACKGROUND

The invention relates generally to encoding using codes that satisfy run-digital-sum and run length limited conditions.

Before recording or transmission, data are typically encoded in accordance with a modulation code, to modify bit patterns in the data that may adversely affect the demodulation and decoding of the data. Certain bit patterns, for example, long runs without transitions, may adversely affect timing recovery, while other patterns may affect signal to noise ratios, and so forth. Accordingly, the modulation codes generally include run length constraints, and are often also referred to as run length limited ("RLL") codes.

High rate codes, that is, codes that produce a code word with a small increase in overall bit count, are desirable for their efficiency. To avoid adversely affecting the rate of transmission, it is desirable to encode long data sequences with high rate codes. However, there is a trade off between efficiency and the complexities associated with manipulating the large sequence of data bits into correspondingly wide code words. Further, code complexities may increase when ran length constraints must be considered. A system that efficiently encodes data using a high rate RLL code is described in U.S. Pat. No. 6,839,004, which is hereby incorporated herein in its entirety by reference.

Low DC content is also important for perpendicular bipolar storage systems. Thus, it is also desirable to utilize a modulation code that produces code words that have relatively low running digital sum ("RDS") values. The RDS values are the sums produced by adding together the +1 and −1 values that correspond to the ones and zeros in the code words. Further, it is desirable to keep the overall number of magnetic transitions low, in order to avoid adversely affecting the signal to noise ratios.

SUMMARY

In accordance with one or more embodiments described herein data may be encoded into a code word that meets run length constraints and has a reduced running digital sum by encoding (N−y)−1 data bits and y flag bits into m first n-bit patterns that form a first N-bit code word, producing a second N-bit code word by encoding the (N−y)−1 data bits and the y flag bits into m second n-bit patterns in which corresponding first and second n-bit patterns combine to meet a first predetermined running digital sum threshold, producing, for y>1, a next N-bit code word by encoding the (N−y)−1 data bits and the y flag bits into m next n-bit patterns in which corresponding first and next n-bit patterns combine to meet a first predetermined running digital sum threshold, and so forth to generate $2^y-1$ next N-bit code words, and selecting the code word that satisfies selection criteria. The selection criteria may, for example, be the word with the fewest transitions, the word with the smallest running digital sum, and so forth.

Also in accordance with one or more embodiments described herein, a system for encoding data into a code word that meets run length constraints and has a reduced running digital sum includes a first encoder that encodes (N−y)−1 data bits and y flag bits into a first N-bit code word with m first n bit patterns, a second encoder that encodes the (N−y)−1 data bits and the y flag bits into a second N-bit code word with m second n-bit patterns in which corresponding first and second n-bit patterns combine to meet a first predetermined running digital sum threshold, $2^y-1$ additional encoders that respectively encode the (N−y)−1 data bits and the y flag bits to produce $2^y-1$ additional N-bit code words with respective code words including m next n-bit patterns in which corresponding first and next n-bit patterns combine to meet a first predetermined running digital sum threshold, and means for selecting the code word that satisfies selection criteria.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
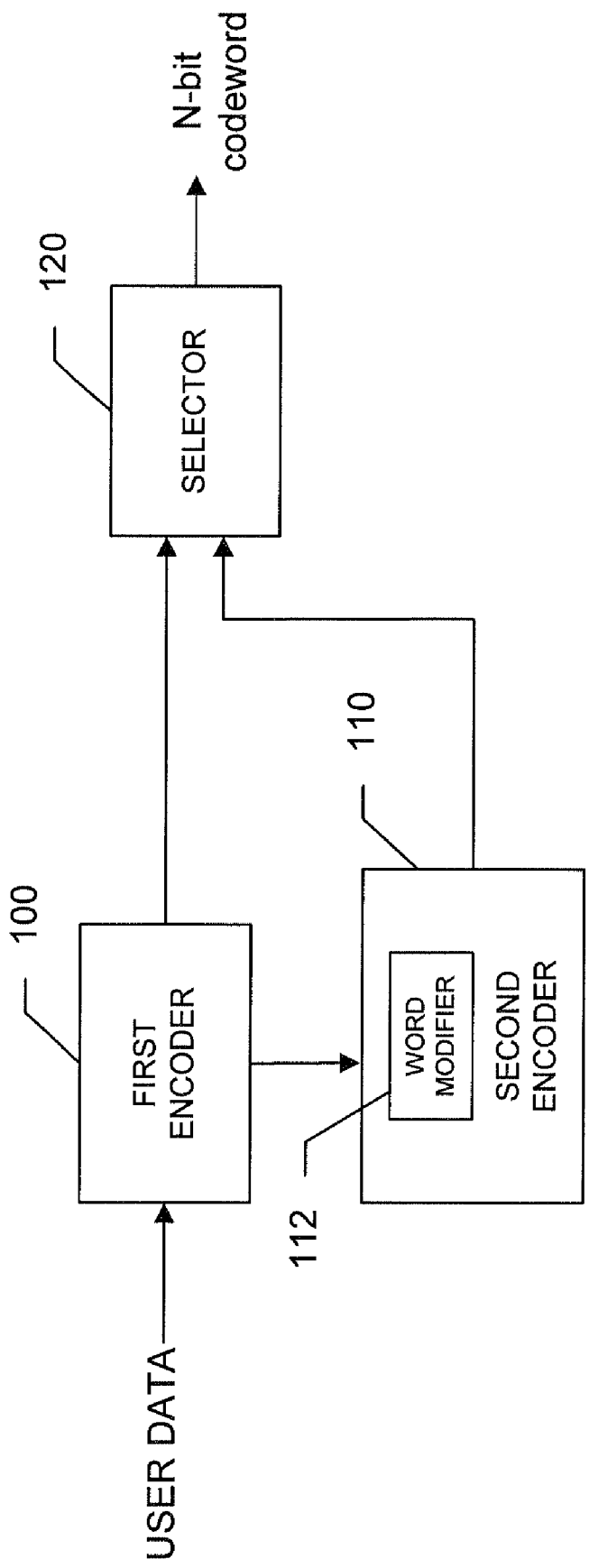
FIG. 1 is a functional block diagram of an encoding system.

Referring to FIG. 1, a first encoder 100 encodes N−y data bits into m n-bit patterns in accordance with a modulation code that meets maximum run length constraints of "j" for consecutive runs of transitions and "k" for consecutive runs with no transitions and a running digital sum ("RDS") threshold of "r." The encoder 100 encodes the (N−y)−1 data bits and y flag bits by producing m n-bit segments, or words, and encoding the n-bit words to produce first n-bit patterns. The first code word consists of the m first n-bit patterns.

There are particular n-bit patterns that cannot be used in the N-bit code word because of the run length constraints and the RDS threshold. For example, n-bit patterns with relatively high |RDS| values and any n-bit patterns that exceed the run length limits of k and j can be eliminated. Thus "v" n-bit patterns are eliminated, and the remaining n-bit patterns may be utilized for the encoding.

The flag bits are included in the first n-bit segment to be encoded, and are set to a first predetermined state, for example, all zeros, for inclusion in the first code word. As discussed in more detail below, the flag bits are set during encoding and used for decoding. In the example, we will use a single flag for ease of explanation. However, multiple flags may be used, as is also discussed in more detail below.

A second encoder 110 encodes the (N−y)−1 data bits and y flag bits, which are set to a second predetermined pattern, in the example, to 1, to produce a second code word. The second codeword consists of m second n-bit patterns, with each second n-bit pattern being a companion pattern to the corresponding n-bit pattern in the first code word. The companion n-bit patterns are such that the sum of the |RDS| of a given n-bit pattern and the |RDS| of its companion is less than or equal to a predetermined value "t." The value of t selected to ensure that at least one of the two N-bit code words has an |RDS| value that is less than (½)*(m*t), where "*" represents multiplication.

In the example, the second encoder 110 modifies the (N−y)−1 data bits in a word modifier 112 and encodes the modified data bits together with the flag bit, which is set to 1. The second encoder subjects the modified bits to the same encoding used in the first encoder, and produces the second N-bit code word. Alternatively, the second encoder may produce the second N-bit code word using a different encoding than is used in the first encoder, with or without first modifying the data bits.

A selector 120 selects which of the first and second N-bit code words best meets the selection criteria. In the example, the selector 120 determines if either or both code words have |RDS| values greater than a threshold S, which may be user programmable. If either or both code words exceed the threshold, the selector 120 selects the code word with the smaller |RDS| value. If both code words have |RDS| values that fall below the threshold, the selector selects the code word with a smaller transition count. Other selection criteria, such as longest or shortest run length, and so forth, may be used instead of or in addition to the |RDS| values and the transition count.

With multiple flags, $2^y-1$ different modified versions of the $(N-y)-1$ data bits may be encoded to produce $2^y$ different code words, and the selector then selects the code word that best meets the selection criteria. Alternatively, the system may use different mappings, different modifiers or combinations of the two to produce the first N-bit code word and the $2^y-1$ code words that each consist of m n-bit patterns that satisfy the companion RDS constraint with respect to the first code word. To meet the selection criteria, the system determines which code words meet the threshold S. If more than one meets the threshold, the system determines which among those meeting the threshold has the fewest transitions. If all fail to meet the threshold, the system selects the code word with the smallest the |RDS| value. Similarly, other selection criteria may be applied to the $2^y$ code words.

Set forth below is an example in which N=480, y=1, m=40 and n=12. The 40 12-bit patterns form a 480-bit code word. The system encodes 479 user bits, which consist of 478 data bits and 1 flag bit, into the 480-bit code word and thus uses an N−1/N code.

There are 4096 possible 12-bit patterns. Undesirable 12-bit patterns, that is, patterns that do not meet RLL constraints and/or an RDS threshold constraint must be eliminated. The constraints are:

1) The leading or trailing 9 bits of each 12-bit code word must not include "000000000" or "111111111,"

2) The leading or trailing 9 bits of each 12-bit code word must not include "101010101" or "010101010," and 3) The |RDS| of each 12-bit pattern must be less than or equal to 8.

There are 64 patterns that do not meet the conditions set forth above, and thus, 4032 12-bit patterns that meet the conditions. In accordance with the teachings of U.S. Pat. No. 6,839,004, which is incorporated herein by reference, the system encodes "p" bit segments into constrained segments that can be combined with 6-bit unconstrained segments to produce 12-bit words that can be mapped to the patterns that meet the three constraints. The code for the 6-bit segments is determined by selecting a value p such that $2^p$ is greater than or equal to 64. In the example, p=6 is selected and a 239/240 code with the added RLL constraint that the respective 6-bit segments can not be all 1's is used to encode 239 of the 479 user bits to form 40 6-bit constrained segments. Each 6-bit constrained segment is then concatenated with 6 of the remaining 240 user bits, to form a 12-bit segment.

The encoding can produce 63*64=4032 different 12-bit segments, which can then be further encoded into or mapped one-to-one to the 4032 12-bit patterns that meet the run length and RDS constraints.

The second encoder takes the 40 12-bit segments and modifies them by, in the example, combining each of them with a term or, as appropriate, one of a number of terms, determined to produce respective 12-bit companion patterns that satisfy the condition:

$$|RDS_f|+|RDSc|\leq 10$$

where the subscripts f and c denote the first and companion 12-bit patterns, respectively. The condition, referred to herein as the "companion RDS constraint," ensures that at least one of the first and second code words has an |RDS|≦200. This is an improvement over a code that uses only the three conditions to produce the 12-bit patterns, since such a code word may have run lengths of 16 for transitions and/or no transitions if, for example, is consecutive 12-bit patterns in the code word have 8 trailing bits and 8 leading bits that have the same transition or no transition runs. Such code words may then have |RDS| values that are higher than the $(½)*(m*t)$.

Figure 2:
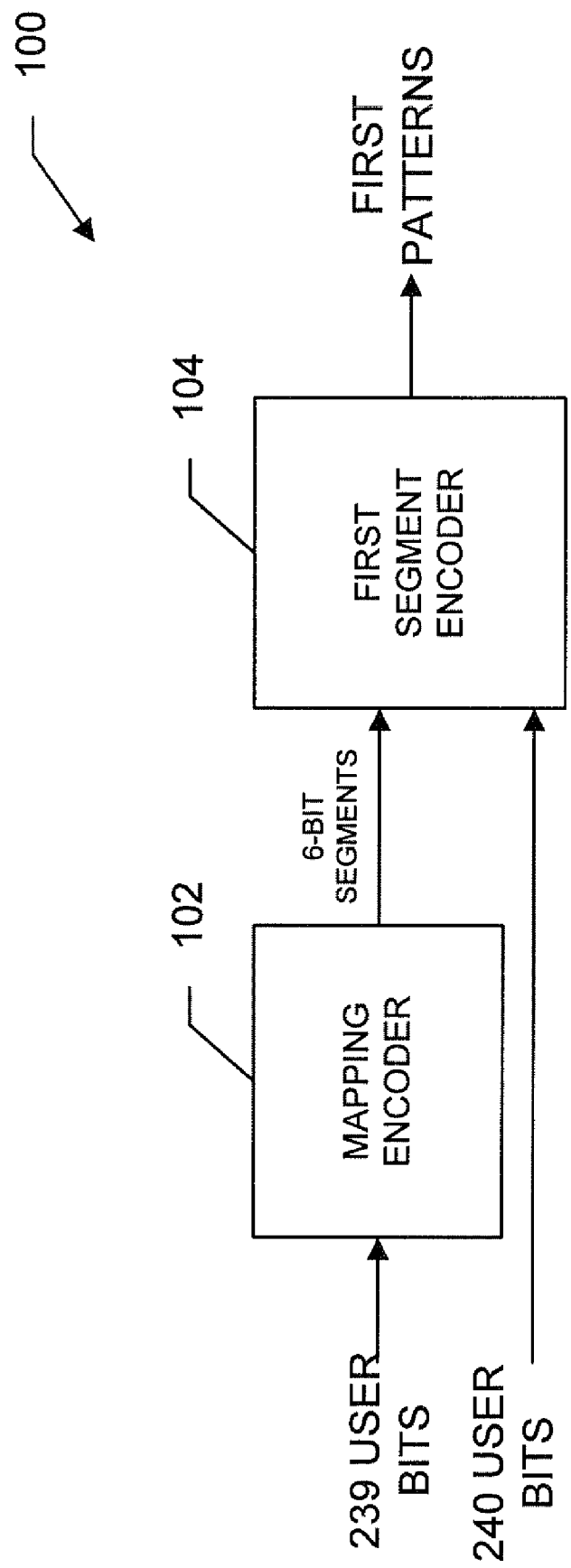
FIG. 2 is a functional block diagram of a first encoder included in the system of FIG. 1.

The encoding is now described in more detail. Referring to FIG. 2, the first encoder 100 consists of a mapping encoder 102 and a segment encoder 104. The mapping encoder 102 maps 239 user bits to 240 bits, which are utilized as 40 6-bit constrained segments. The constrained segments satisfy the RLL constraint that no segment may be all ones. The mapping encoder is described in more detail below with reference to FIG. 3.

The segment encoder 104 utilizes the 240 remaining user bits as 40 6-bit data segments. Each 6-bit data segment is concatenated with a corresponding 6-bit constrained segment, to produce 40 12-bit segments. In the example, the segment encoder maps the 40 12-bit segments directly as the 40 12-bit first patterns that form the first N-bit codeword. Alternatively, the segment encoder 104 may further manipulate the 12-bit segments to produce the 12-bit first patterns.

In general, the system generates m $n_1$-bit constrained segments to concatenate with m $n_2$-bit data segments to produce the m n-bit segments, where $n_1+n_2=n$.

Figure 3:
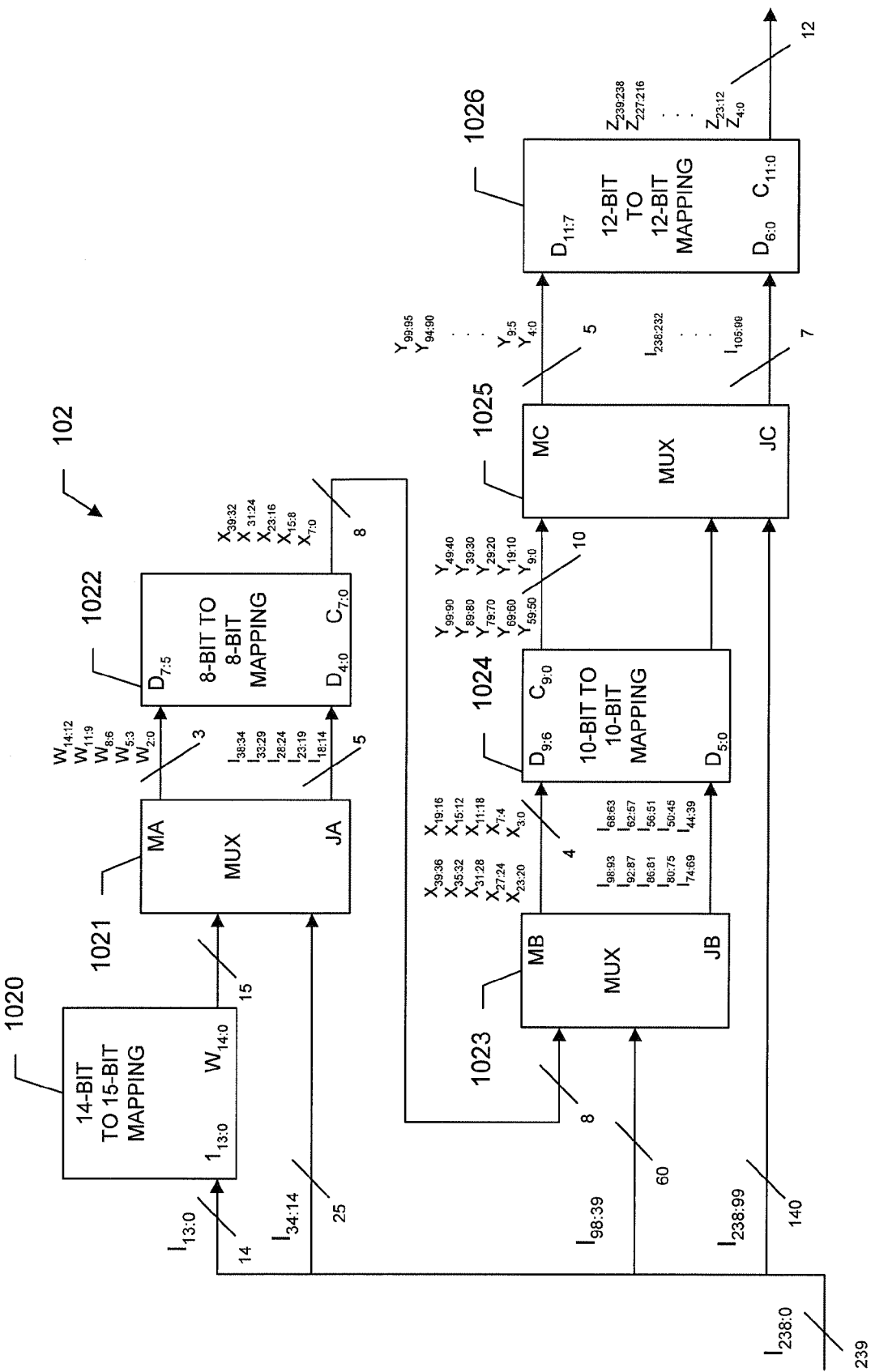
FIG. 3 is a functional block diagram of a mapping encoder included in the encoder of FIG. 2.

Referring now to FIG. 3, the mapping encoder 102 consists of multiple stages. In the example, a first stage 1020 maps the leading 14 input bits into five 3-bit segments that meet the constraint that a segment cannot be all ones. A multiplexer 1021 provides the 3-bit constrained segments produced by the first stage and 25 user bits in groups of five to a second stage 1022. The second stage 1022 mates each of the 3-bit segments with five user bits and maps the eight bits into two 4-bit segments that meet the constraint that a segment cannot be all ones. The second stage produces a total of 10 4-bit constrained segments.

The second stage provides the 4-bit constrained segments through a multiplexer 1023 to a third stage 1024. The multiplexer 1023 also provides to the third stage 60 user bits, which are utilized as 10 6-bit segments. The third stage 1024 mates six user bits with respective 4-bit segments and maps the 10 bits into pairs of 5-bit segments, which meet the constraint that a segment cannot be all ones. The third stage produces a total of 20 5-bit constrained segments. A multiplexer 1025 receives the 20 5-bit constrained segments and 140 user bits, which are to be utilized in segments of 7 bits. The multiplexer provides respective 7-bit segments and 5-bit constrained segments to a fourth stage 1026, which performs a 12-bit to 12-bit mapping, to produce 20 pairs of 6-bit constrained segments. Each 6-bit segment meets the constraint that the segment cannot be all ones and further meets conditions that ensure that the segment can be combined with 6-bit unconstrained user bit segments to produce 12-bit segments that meet the three constraints set forth above.

The 40 6-bit constrained segments are supplied to the segment encoder 104 (FIG. 2), which mates them with respective 6-bit segments of the remaining 240 user bits, to produce the 12-bit segments, or words. The flag bit is included in the user data and is positioned such that the bit is included in the first 12-bit pattern in the N-bit code word. In the example, the flag bit is the first bit of the 240 user bits to be encoded. The segment encoder then encodes the 12-bit words to produce the 12-bit patterns that form the N-bit first code word. In the example, the segment encoder maps the 12-bit words directly as the 12-bit first patterns.

At the same time the 40 12-bit segments produced by the mapping encoder 102 are utilized in the second encoder 110. However, the flag bit is set to a predetermined state that differs from the state utilized in the first encoder. In the example, the flag bit is set to a one for use in the second encoder.

Figure 4:
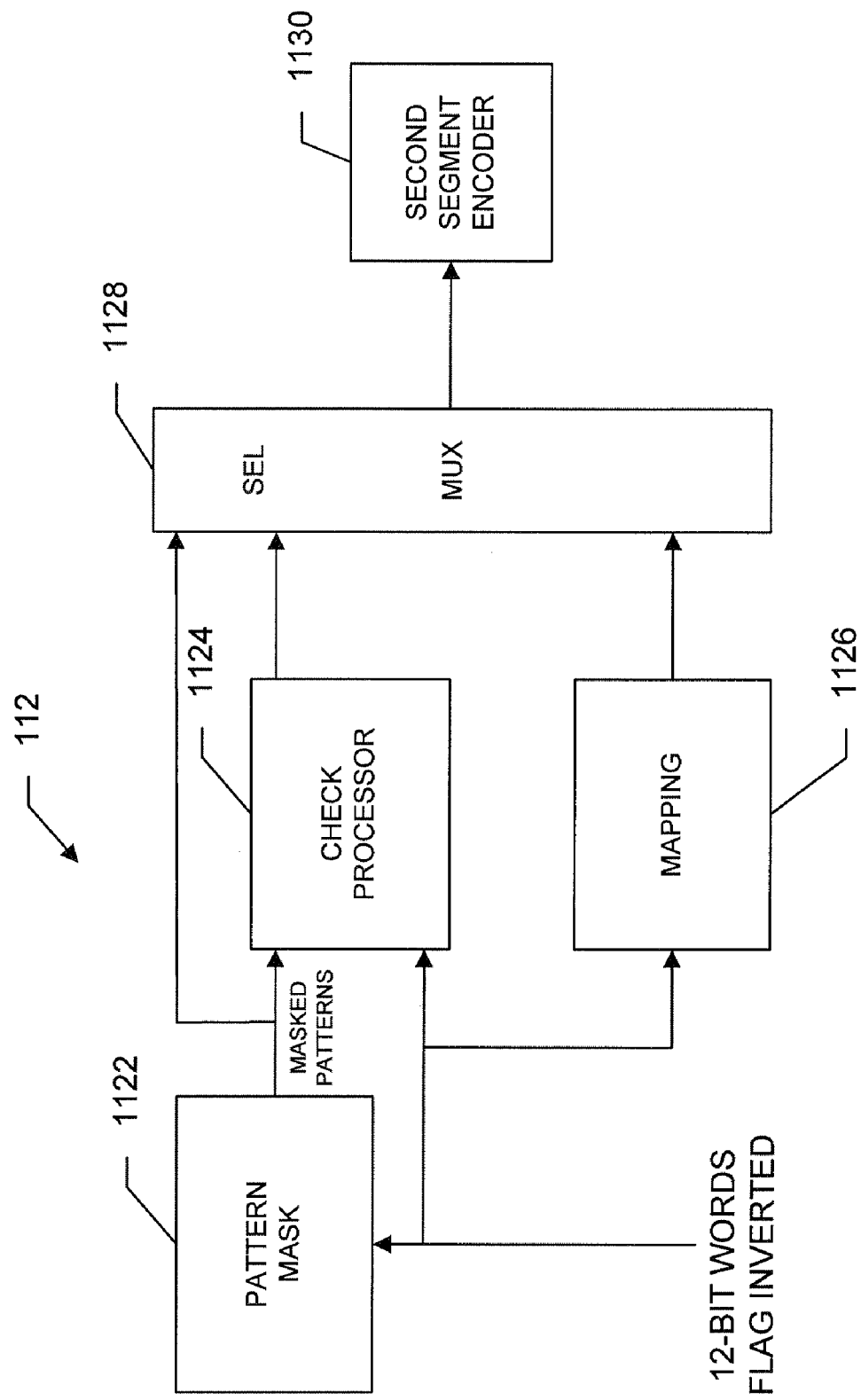
FIG. 4 is a functional block diagram of a second encoder included in the system of FIG. 1.

Referring now to FIG. 4, the second encoder 110 includes the word modifier 112 which modifies the words. The word modifier 112 includes a pattern mask block 1122 that applies a pattern mask to the respective 12-bit words. In the example, the pattern mask block combines a selected term, or as appropriate, one of a number of selected terms, with the respective 12-bit words using an exclusive-OR operation. The pattern mask exclusive-OR's hexadecimal 0xAD6 with all of 12-bit words except words with 101011 as the six most significant bits. A hexadecimal pattern of 0x016 is used for such 12-bit words, to avoid producing a masked word that consists of six 0s at the most significant bits. As is understood by those skilled in the art, for ease of manipulation, the 6 most significant bits of the 12-bit words are inverted before masking, such that the six most significant bits of the masked word are not all 0s. Further, additional masked words may be undesirable and other terms may be applied as pattern masks to avoid them.

A check processor 1124 next manipulates the 40 12-bit masked words and the corresponding 12-bit first patterns (which in the example are the same as 12-bit words) to determine if the masked words meet the companion RDS constraint. If a given masked word meets the constraint, the 12-bit masked word is supplied to a second segment encoder 1130. Otherwise, a different mapping or the manipulation of the 12-bit word is required, and the word is supplied to a mapping block 1126. The mapping block produces a 12-bit mapped word that is the companion of the 12-bit word, that is, a mapped word that meets the companion RDS constraint. A multiplexer 1128 provides the appropriate 12-bit masked words or 12-bit mapped words to the second segment encoder, which produces the 12-bit second patterns. The second encoder operates in the same manner as the first encoder, and maps the words directly as the 12-bit second patterns that form the second code word.

The pattern masks are carefully selected such that all but a small number of masked words are the companions to the corresponding unmasked words. Accordingly, mapping is required for only the small number of words.

Figure 5:
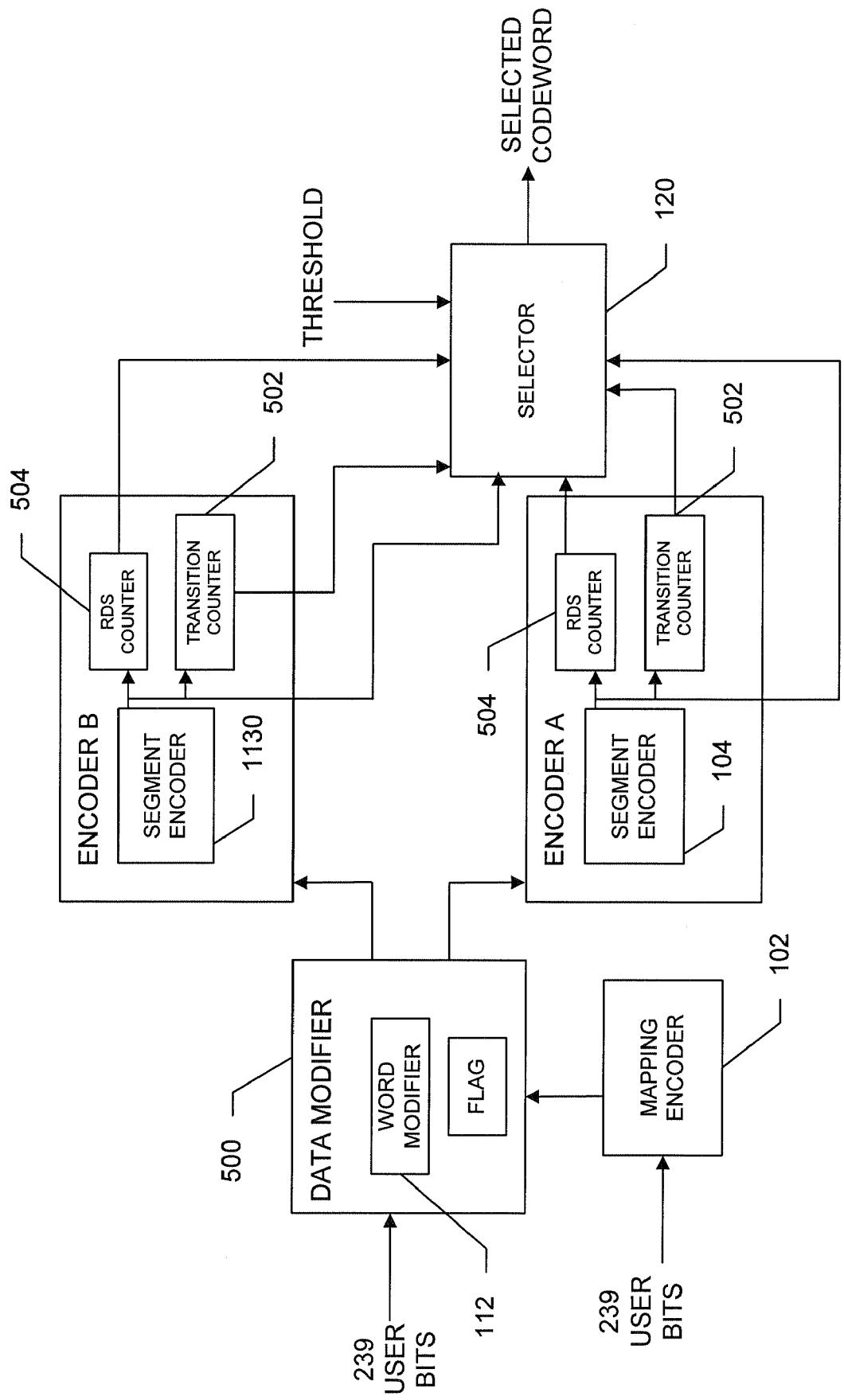
FIG. 5 is a functional block diagram of an alternative embodiment of the encoder of FIG. 1.

FIG. 5 illustrates an alternative embodiment of the encoding system. The mapping encoder 102 operates in the manner described above with reference to FIG. 2 to produce the 6-bit constrained segments. A data modifier 500 is provided 239 data bits and contributes an additional flag bit. The data modifier contributes a flag bit set to a first predetermined state to the user bits that are provided, without further modification, to encoder A. The data modifier contributes a flag bit set to a second predetermined state to the bits that are provided to the word modifier 112. The word modifier operates in the manner described above with reference to FIG. 4, to produce the modified words that are provided to encoder B.

Encoder A includes the first segment encoder 104 (FIG. 2), a transition counter 502 and an RDS counter 504. Encoder B includes the second segment encoder 1130 (FIG. 4), and a transition counter 502 and an RDS counter 504. In the example, the second segment encoder operates in the same manner as the first segment encoder. The transition counters operate in a known manner to count the transitions in the respective N-bit code words. The RDS counters similarly operate in a known manner to produce running digital sums for the N-bit code words. The RDS counts for the first and second code word are supplied to the selector 120, which compares their absolute values to a threshold R to determine if either or both of corresponding |RDS| values exceed the threshold. If so, the selector selects the code word that has the smaller |RDS| value. If both code words have |RDS| values that are below the threshold, the selector selects the code words with the lower transition count.

The parameter R, which acts as the RDS threshold, may be user programmable, such that the decision between the first and second code word may be based more on the |RDS| value than the transition count or vice versa, depending on the environment in which the encoding system is to be used.

As is understood by those skilled in the art, operations performed by the various processors and blocks described above with reference to FIGS. 1-5 may be performed in parallel, to increase the throughput of the system.

Figure 6:
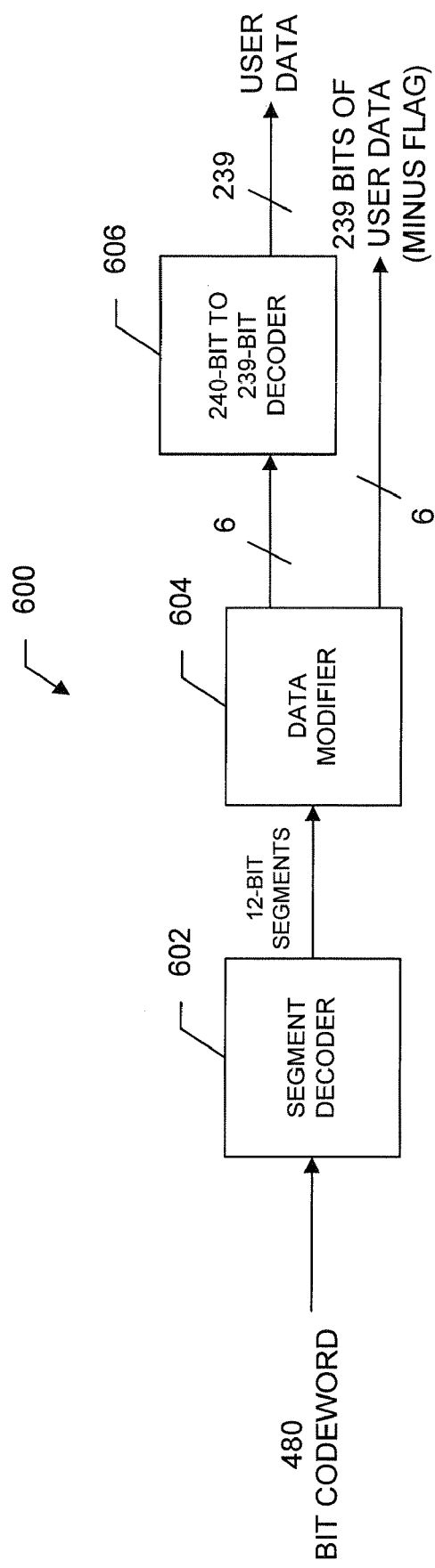
FIG. 6 is a functional block diagram of a decoding system.

FIG. 6 depicts a decoder 600 for use with the current system. The 480 bit code word is provided to a segment decoder that produces corresponding 12-bit segments. The segments are sent to a data modifier 604, which determines if the flag bit contained in the first 12-bit segment is set to a 1 or 0. If the flag bit is set to one, the 40 12-bit segments are modified before further decoding. The modification rule is the same rule used in the encoding, and thus, the bits are XOR'd with an appropriate pattern mask term or they are mapped to an appropriate 12-bit (unmodified) word, in accordance with the operations performed during encoding. If the flag bit is set to zero, the 40 12-bit segments are further decoded as the 12-bit words without modification.

The data modifier 604 next supplies the six least significant bits of respective 12-bit words directly as user data and the six most significant bits as 6-bit constrained segments to a 240-bit to 239-bit decoder 606. The decoder reproduces the 239 user bits from the 240 constrained bits. To do this, the decoder decodes each pair of 6-bit segments into a 5-bit constrained segment and 7 bits of user data. Each pair of the 5-bit segments are further decoded into a 4-bit constrained segment and 6 bits of user data. Next, a pair of 4-bit segments are further decoded into a 3-bit constrained segment and 5 bits of user data. Five 3-bit segments are then decoded by 15-bit to 14-bit decoding to reproduce the final 14 bits of the user data. The decoding, like the encoding, can be performed in 40 clock cycles, with the mapping and constrained segment encoding and decoding steps performed as bit manipulations such as a word inverse operation and/or bitwise OR, AND, XOR and inverse operations.

The decoding of code words in which multiple flags are used is performed in a similar manner, with the decoder using the modification and/or segment decoding steps that correspond to the states of the flags.

What is claimed is:

1. A method including the steps of:
   producing a first N-bit code word by encoding (N−y)−1 data bits and y flag bits into first m n-bit patterns;
   producing a second N-bit code word by encoding the (N−y)−1 data bits and the y flag bits into second m n-bit patterns in which corresponding first and second n-bit patterns combine to meet a first predetermined running digital sum threshold;

selecting one of the first N-bit code word and the second N-bit code word that satisfies selection criteria.

2. The method of claim 1 wherein the step of selecting includes selecting the code word with the fewest transitions if all code words meet a second predetermined running digital sum threshold.

3. The method of claim 2 wherein the step of selecting further includes selecting the code word with the smallest running digital sum if any code word exceeds the second predetermined running digital sum threshold.

4. The method of claim 1 wherein the step of selecting includes selecting the codeword with the smallest running digital sum.

5. The method of claim 1 wherein the step of producing the second codeword includes modifying the data and flag bits and encoding the modified bits.

6. The method of claim 5 wherein the data and flag bits and the modified data and flag bits are encoded in a similar manner.

7. The method of claim 1 further including producing $2^y-1$ additional N-bit code words by encoding the (N−y)−1 data bits and y flag bits into $2^y-1$ respective additional m n-bit patterns in which corresponding n-bit patterns from the first code word and respective additional code words combine to meet a first predetermined running digital sum threshold.

8. The method of claim 7 wherein the step of producing the additional code words includes modifying the data and flag bits differently for each additional code word and encoding the modified bits.

9. The method of claim 8 wherein the respective modified data and flag bits are encoded in the same manner as the (N−y)−1 and y flag bits.

10. The method of claim 7 wherein the step of selecting includes determining which code words meet a second predetermined running digital sum threshold and if more than one code word meets the threshold selecting the code word that both meets the threshold and has the fewest transitions.

11. The method of claim 10 wherein the step of selecting further includes selecting the code word with the smallest running digital sum if all of the code words exceed the second predetermined running digital sum threshold.

12. The method of claim 7 wherein the step of selecting includes selecting the codeword with the smallest running digital sum.

13. The method of claim 1 wherein the first and second n-bit patterns meet run length constraints and a running-digital-sum threshold.

14. The method of claim 1 wherein the first and second corresponding n-bit patterns combine by adding together the absolute values of the running-digital-sums of the two patterns.

15. An encoding system comprising
- a first encoder for encoding (N−y)−1 data bits and y flag bits to produce first N-bit code word that consists of first m n-bit patterns;
- a second encoder for encoding the (N−y)−1 data bits and y flag bits to produce a second N-bit code word that consists of second m n-bit patterns that are companions of corresponding first n-bit patterns, the respective patterns and companions having running-digital-sum absolute values that added together meet a first predetermined running digital sum threshold; and
- a selector for selecting one of the first N-bit code word and the second N-bit code word that satisfies selection criteria.

16. The system of claim 15 wherein the first encoder produces n-bit patterns that meet run length limited constraints and a running digital sum threshold set for the patterns.

17. The system of claim 16 wherein the first encoder produces the n-bit patterns by encoding $(m*n_1)-1$ bits into m $n_1$-bit constrained segments and concatenating the constrained segments with m segments of $n_2$ unconstrained data bits.

18. The system of claim 17 wherein the second encoder produces the second n-bit patterns by modifying the n-bit patterns produced by the first encoder.

19. The system of claim 16 wherein the first encoder produces the $n_1$-bit constrained pattern in a multiple stage encoder that in each stage maps constrained segments and appended user bits to pairs of constrained segments.

20. The system of claim 19 further including a decoding subsystem that comprises
- a segment decoder that segments the N-bit codeword into n-bit segments,
- a data modifier that modifies the n-bit segments if one or more included flag bits are set to states other than a first state, and
- a decoder that decodes N bits to (N−y)−1 bits.

21. The system of claim 20 wherein the decoder
- maps the n-bit patterns to $n_1$-bit constrained segments and $n_2$-bits of user data,
- in multiple stages maps the constrained segments to user bits and smaller constrained segments, and
- in a last stage maps a constrained segment to user bits.

22. An encoding system comprising
- a first encoder for encoding (N−y)−1 data bits and y flag bits to produce a first N-bit code word that consists of first m n-bit patterns that meet run length constraints and a running digital sum threshold;
- a second encoder for encoding the (N−y)−1 data bits and y flag bits to produce a second N-bit code word that consists of second m n-bit patterns that are companions of corresponding first n-bit patterns, the respective patterns and companions having running-digital-sum absolute values that added together meet a companion running digital sum constraint;
- $2^y-1$ additional encoders that respectively encode the (N−y)−1 data bits and the y flag bits to produce $2^y-1$ additional N-bit code words with respective code words including m next n-bit patterns that are companions of corresponding first n-bit patterns, the respective patterns and companions having running-digital-sum absolute values that added together meet a companion running digital sum constraint; and
- a selector for selecting one of the first N-bit code word, second N-bit code word and additional N-bit code words that satisfies selection criteria.

\* \* \* \* \*